United States Patent
Nakagawa et al.

(10) Patent No.: US 7,795,581 B2
(45) Date of Patent: Sep. 14, 2010

(54) PATTERN MEASURING METHOD AND ELECTRON MICROSCOPE

(75) Inventors: Shuichi Nakagawa, Hitachinaka (JP); Sho Takami, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 11 days.

(21) Appl. No.: 12/038,116

(22) Filed: Feb. 27, 2008

(65) Prior Publication Data

US 2008/0210865 A1  Sep. 4, 2008

(30) Foreign Application Priority Data

Mar. 2, 2007  (JP) .............. 2007-052150

(51) Int. Cl.
G01N 21/00 (2006.01)
G01N 23/00 (2006.01)
G21K 7/00 (2006.01)

(52) U.S. Cl. .............. 250/310; 250/311; 382/144; 382/145; 356/239.3

(58) Field of Classification Search ............... 250/306, 250/307, 309–311; 382/141, 143, 144, 145, 382/149; 356/237.4, 237.5, 239.3
See application file for complete search history.

(56) References Cited

U.S. PATENT DOCUMENTS

| 6,667,483 | B2 * | 12/2003 | Kobaru et al. .............. 250/492.2 |
| 6,947,587 | B1 * | 9/2005 | Maeda et al. ................ 382/149 |
| 7,109,483 | B2 * | 9/2006 | Nakasuji et al. ............. 250/310 |
| 7,230,243 | B2 * | 6/2007 | Tanaka et al. ............... 250/310 |
| 7,274,813 | B2 * | 9/2007 | Maeda et al. ................ 382/141 |
| 7,420,168 | B2 * | 9/2008 | Mizuno et al. .............. 250/311 |
| 7,476,856 | B2 * | 1/2009 | Watanabe et al. ........... 250/310 |
| 2002/0130262 | A1 * | 9/2002 | Nakasuji et al. ............. 250/311 |
| 2005/0285034 | A1 * | 12/2005 | Tanaka et al. ............... 250/310 |
| 2005/0285035 | A1 * | 12/2005 | Mizuno et al. .............. 250/310 |
| 2006/0038987 | A1 * | 2/2006 | Maeda et al. .............. 356/237.5 |
| 2008/0101685 | A1 * | 5/2008 | Maeda et al. ................ 382/149 |
| 2008/0203298 | A1 * | 8/2008 | Ishijima et al. ............. 250/307 |
| 2008/0272297 | A1 * | 11/2008 | Mizuno et al. .............. 250/307 |

FOREIGN PATENT DOCUMENTS

| JP | 3-291842 A | 12/1991 |
| JP | 6-283125 A | 10/1994 |
| JP | 9-166428 A | 6/1997 |
| JP | 9-245709 A | 9/1997 |

* cited by examiner

Primary Examiner—Bernard E Souw
(74) Attorney, Agent, or Firm—Crowell & Moring LLP

(57) ABSTRACT

An object of the present invention is to provide a pattern measuring method and an electron microscope that achieve truly high measurement throughput by achieving both precise location of a measurement target position and high-speed movement of the scanning position of an electron beam to the measurement target position. In order to attain the object described above, according to an aspect of the present invention, there is provided a pattern measuring method and an apparatus that move the scanning position of an electron beam based on coordinate information about a first pattern, which is a target to be measured with the electron beam, move the scanning position of the electron beam to a region comprising a second pattern, the relative distance of which from the first pattern is previously registered, in a case where detection of the first pattern at the point of arrival fails, and move the scanning position of the electron beam based on detection of the second pattern and information about the relative distance.

6 Claims, 6 Drawing Sheets

101 ··· ELECTRON GUN
102 ··· ELECTRON BEAM
103 ··· OBJECTIVE LENS
104 ··· SAMPLE
105 ··· DEFLECTION SIGNAL GENERATOR
106 ··· COMPUTER
107 ··· DEFLECTION AMPLIFIER
108 ··· DEFLECTION COIL
109 ··· DETECTOR
110 ··· IMAGE CONTROLLING SECTION
111 ··· IMAGE DISPLAYING CRT
112 ··· SAMPLE STAGE
113 ··· STAGE CONTROLLING SECTION
114 ··· DIRECT CURRENT AMPLIFIER
115 ··· IMAGE SHIFTING COIL

101 ··· ELECTRON GUN
102 ··· ELECTRON BEAM
103 ··· OBJECTIVE LENS
104 ··· SAMPLE
105 ··· DEFLECTION SIGNAL GENERATOR
106 ··· COMPUTER
107 ··· DEFLECTION AMPLIFIER
108 ··· DEFLECTION COIL
109 ··· DETECTOR
110 ··· IMAGE CONTROLLING SECTION
111 ··· IMAGE DISPLAYING CRT
112 ··· SAMPLE STAGE
113 ··· STAGE CONTROLLING SECTION
114 ··· DIRECT CURRENT AMPLIFIER
115 ··· IMAGE SHIFTING COIL

201 ··· ADDRESSING PATTERN
202 ··· MEASURING PATTERN
203 ··· CROSS-HAIR CURSOR

Magnification: Three hundred thousand times

PATTERN MEASURING METHOD AND ELECTRON MICROSCOPE

BACKGROUND OF THE INVENTION

1. Field of the Invention

The present invention relates to a pattern measuring method and an electron microscope. In particular, it relates to a pattern measuring method for measuring a pattern quickly with high precision and an electron microscope.

2. Background Art

With the recent miniaturization of semiconductor elements, not only the manufacturing equipment but also the inspection and the evaluation equipment are required to be more precise. Scanning electron microscopes (referred to as length measuring SEM, hereinafter) capable of length measurement are commonly used to determine whether the geometrical dimensions of the pattern formed on the semiconductor wafer are appropriate or not.

The length measuring SEM irradiates a wafer with an electron beam, processes the resulting secondary electron signal to form an image, and discriminates the edge of the pattern based on the variations in contrast of the image to derive the dimensions of the pattern (see JP Patent Publication (Kokai) No. 9-166428A (1997) (paragraphs [0012] to [0016] and FIG. 4), for example). To conform to the 35-nm-node design rule, dimension measurement is preferably carried out with an observation magnification of three hundred thousand times or higher. In that case, the entire screen displaying the sample image is equivalent to a square on the wafer having a size of 500 nm by 500 nm or smaller. In order to position a field of view (FOV) at a measurement position within the display screen, the precision of positioning of the field of view has to be on the order of several tens nm at a minimum. However, even when the resolution of the position transducer (laser length measuring machine, for example) of a sample stage is of the order of sub-nanometer, the measuring pattern cannot be positioned at any position within the display screen if the sample stage is inclined or the wafer is displaced on the stage because of some external disturbance.

According to a conventional technique to avoid such a problem, an image is first acquired with a magnification lower than the dimension measuring magnification (ten to twenty thousand times, for example), a characteristic pattern (referred to as addressing pattern, hereinafter) whose positional relationship with the measuring pattern is known is detected from the data about the acquired image, the sample stage is moved or the scanning position of the electron beam is offset based on the position information about the characteristic pattern, thereby precisely positioning the field of view (FOV) for measurement at the measurement position within the display screen with the dimension measuring magnification (see JP Patent Publication (Kokai) No. 3-291842A (1991), for example). According to this technique, even if there are a large number of other patterns closely resembling the measuring pattern in the vicinity of the measuring pattern, the measuring pattern can be surely extracted, and the dimensions thereof can be measured.

In JP Patent Publication (Kokai) No. 9-245709A (1997), there is described a technique of registering as models a plurality of patterns whose relationships with a target position on a sample is known, detecting a pattern similar to any of the registered models, and detecting the target position on the sample based on the position of the pattern and an previously registered offset.

In JP Patent Publication (Kokai) No. 6-283125A (1994), there is described a technique of moving a sample stage to move the field of view in a spiral pattern centered around the initial field of view until a target object is found, in the case where the target object is not found at the target position.

SUMMARY OF THE INVENTION

In the methods of locating a pattern using an addressing pattern described in JP Patent Publication (Kokai) No. 9-166428A (1997) (paragraphs [0012] to [0016] and FIG. 4), JP Patent Publication (Kokai) No. 3-291842A (1991), and JP Patent Publication (Kokai) No. 9-245709A (1997), a pattern that is not directly relevant to the measurement has to be detected in each measurement, and therefore, there is a problem that the throughput of the apparatus decreases. The scanning position of the electron beam can also be moved based on the coordinate information about the measurement position without using the addressing pattern. However, in that case, there is a problem that it takes longer to locate the measurement position if the target pattern is not found at the point of arrival. In particular, the method described in JP Patent Publication (Kokai) No. 6-283125A (1994), in which the peripheral area is searched little by little for the target position in the case where the target position is not contained in the initial field of view, there is a problem that it takes a long time to find the target pattern. As described above, precise location of a pattern takes a corresponding length of search time. Thus, the speed of pattern measurement and the precision of pattern location are in a trade-off relationship.

An object of the present invention is to provide a pattern measuring method and an electron microscope that achieve truly high measurement throughput by achieving both precise location of a measurement target position and high-speed movement of the scanning position of an electron beam to the measurement target position.

In order to attain the object described above, according to an aspect of the present invention, there is provided a pattern measuring method and an apparatus that move the scanning position of an electron beam based on coordinate information about a first pattern, which is a target to be measured with the electron beam, move the scanning position of the electron beam to a region containing a second pattern, the relative distance of which from the first pattern is previously registered, in a case where detection of the first pattern at the point of arrival fails, and move the scanning position of the electron beam based on detection of the second pattern and information about the relative distance.

With such an arrangement, if the first pattern is detected based on the coordinate information about the first pattern, the measurement of the first pattern can be carried out immediately. Even if detection of the first pattern fails, the first pattern can be located using the second pattern, and therefore, the failure of pattern detection can be recovered.

That is, detection of the first pattern is carried out first, and the pattern detection using the second pattern is carried out only when the detection of the first pattern fails. Therefore, the throughput is improved compared with the technique of determining the scanning position using the addressing pattern for every pattern.

According to the aspect of the present invention described above, the scanning position of the electron beam can be moved quickly to the measurement target pattern, and the pattern measurement can be carried out more quickly.

DETAILED DESCRIPTION OF THE PREFERRED EMBODIMENTS

Figure 1:
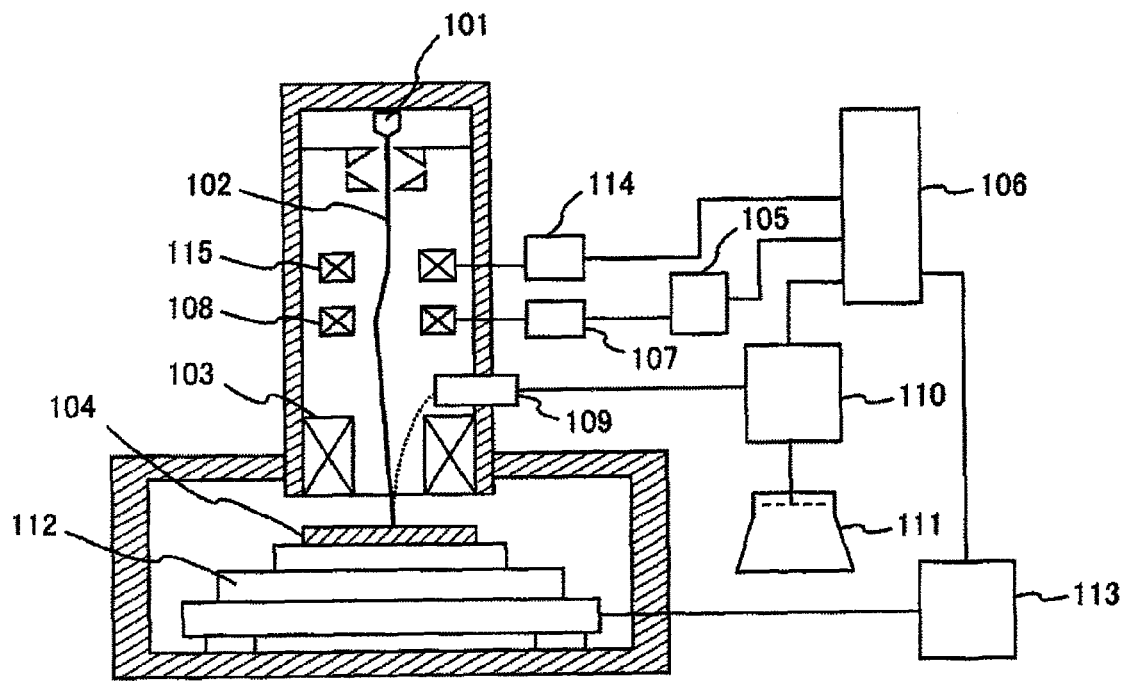
FIG. 1 is a diagram showing the whole of a configuration of an electron microscope apparatus according to an embodiment of the present invention.
Figure 2:
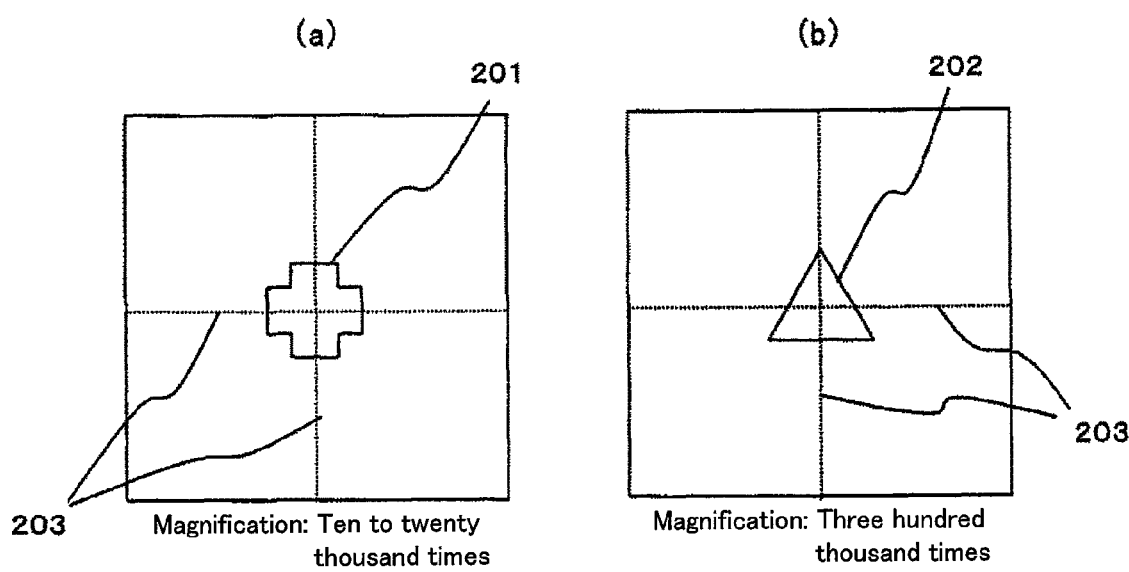
FIG. 2 includes diagrams for illustrating a dimension measuring method for the electron microscope apparatus according to the embodiment of the present invention.

In an example of the present invention described below, the field of view is moved directly to a first local feature (a first pattern), which is a measurement target, and only when the first local feature is not detected in a display screen displaying the image of the sample, the field of view is moved to a second local feature (a second pattern) that can be easily detected and located and the relative distance of which from the first local feature is known, the second local feature is detected, and the field of view is moved, based on the relative distance, to the position where the first local feature is expected to be found.

According to an aspect of the present invention, the field of view can be moved between the first local feature and the second local feature by offsetting the scanning position of the electron beam or changing the scanning region, rather than using a sample moving mechanism.

Furthermore, according to an aspect of the present invention, in the case where the dimension data about the first local feature detected and measured differs from reference dimension data previously registered, the second local feature the relative distance of which from the first local feature is known is detected, and the first local feature is detected based on the position of the second local feature and the relative distance, and the dimensions of any part of the first local feature are measured.

According to an aspect of the present invention, dimension measurement of the first local feature is ended if the difference between the dimension data about any part of the detected first local feature and the reference dimension data previously registered falls within a preset threshold.

Furthermore, according to an aspect of the present invention, there is a function of monitoring the time required for dimension measurement. Thus, for a sample that requires frequent movements of the field of view to the second local feature and accordingly a longer time for dimension measurement, the field of view is moved to the second local feature from the beginning.

According to the aspect of the present invention described above, in the dimension measurement, the field of view is directly moved to the first local feature, which is a measurement target, and only when the detection of the first local feature fails or the measured dimension data does not match with the reference dimension data previously registered, the field of view is moved to the second local feature that can be easily detected and located. Therefore, an electron microscope apparatus having an improved throughput and a dimension measuring method for the apparatus that improves the throughput can be provided.

In the following, with reference to the drawings (FIGS. 1 to 6), an electron microscope apparatus according to an embodiment of the present invention and a dimension measuring method for the apparatus will be described in detail. In this embodiment, for example, the electron microscope is a critical dimension scanning electron microscope (SEM).

FIG. 1 is a diagram showing the whole of the configuration of an electron microscope apparatus according to an embodiment of the present invention. An electron beam 102 emitted from an electron gun 101 is narrowed down by an objective lens 103 and then applied onto a sample 104. A deflection signal generated by a deflection signal generator 105 makes a computer 106 change the scanning range and the scanning position on the sample 104 and makes a deflection amplifier 107 energize a deflection coil 108 to two-dimensionally scan the sample 104 with the electron beam 102. A signal generated from the electron beam 102 incident on the sample 104 (a secondary electron signal, a backscattered electron signal, or the like) is converted into an electrical signal by a detector 109, and the electrical signal is processed by an image controlling section 110 and sent to an image displaying CRT 111. The computer 106 can read the whole or part of the image data in the image controlling section 110 and acquire position information (coordinate information) about a cross-hair cursor (not shown) that can be arbitrarily moved on the screen of the image displaying CRT 111 that displays an image corresponding to the image data.

A sample stage 112 on which the sample 104 is placed moves under the control of a stage controlling section 113 to change the scanning position of the electron beam 102 on the sample 104 and move the field of view. Alternatively, the field of view can also be moved by a direct current amplifier 114 energizing an image shifting coil 115, thereby offsetting the scanning position of the electron beam 102 on the sample 104. The amount of the movement of the field of view is controlled by the computer 106 (a controller).

With such a configuration, according to the present invention, the following procedure is carried out. First, processes of registering a measuring pattern and an addressing pattern will be described with reference to FIGS. 1 and 2.

First, the sample 104 (a wafer, for example) including a measuring pattern, which is a measurement target, is placed on the sample stage 112, and the sample 104 is irradiated with the electron beam 102, and the image is displayed on the image displaying CRT 111.

Then, the sample stage 112 is moved so that an addressing pattern appears in the displayed image, the cross-hair cursor is placed at the addressing pattern, and a registration command is issued to the computer 106. The computer 106 acquires and saves cursor position information and saves image data about a part of the image centered on the cursor position as the addressing pattern. In this step, the magnification of the displayed image is lower than the dimension measuring magnification, specifically ten to twenty thousand times, and the addressing pattern used lies adjacent to the measuring pattern (within a distance of several micrometers). The procedure described above is the addressing pattern registration procedure (see FIG. 2(A)).

As the addressing pattern (the second pattern), a pattern that is more appropriate as the addressing pattern than the first pattern should be selected, and a pattern larger than the first pattern is preferably selected. Furthermore, a pattern having a more unique shape is preferably selected.

Then, the cross-hair cursor is placed at the measuring pattern, and a registration command is issued to the computer 106. The computer 106 acquires and saves cursor position information and a length measuring pattern image, determines the relative distance between the target measuring pattern and the addressing pattern from that cursor position information and the cursor position information about the addressing pattern saved in the addressing pattern registration procedure, and saves the relative distance. In this step, the magnification is the dimension measuring magnification (about three hundred thousand times). The procedure described above is the measuring pattern registration procedure (see FIG. 2(B)).

In this example, since whether the measuring pattern is appropriate or not has to be first determined, the measuring pattern image or waveform information (line profile) is previously acquired. In the determination of whether the pattern is appropriate or not, shape matching or line profile comparison is carried out. If the coincidence is higher than a predetermined value, it is determined that the pattern is appropriate as the measurement target, and the location based on the addressing pattern can be omitted.

Furthermore, in this example, in order to verify the result of the dimension measurement, a template that specifies a threshold for an expected dimension measurement value (which can be a representative dimension measurement value of the wafer on which the normal pattern is formed) can be previously prepared. The threshold can be arbitrarily set by the operator. How to use the template will be described later.

The procedure described above can be carried out one time at the start of the detection process.

Now, with reference to FIGS. 3, 4 and 5, the electron microscope apparatus according to this embodiment of the present invention and the dimension measuring method for the apparatus will be described.

Figure 3:
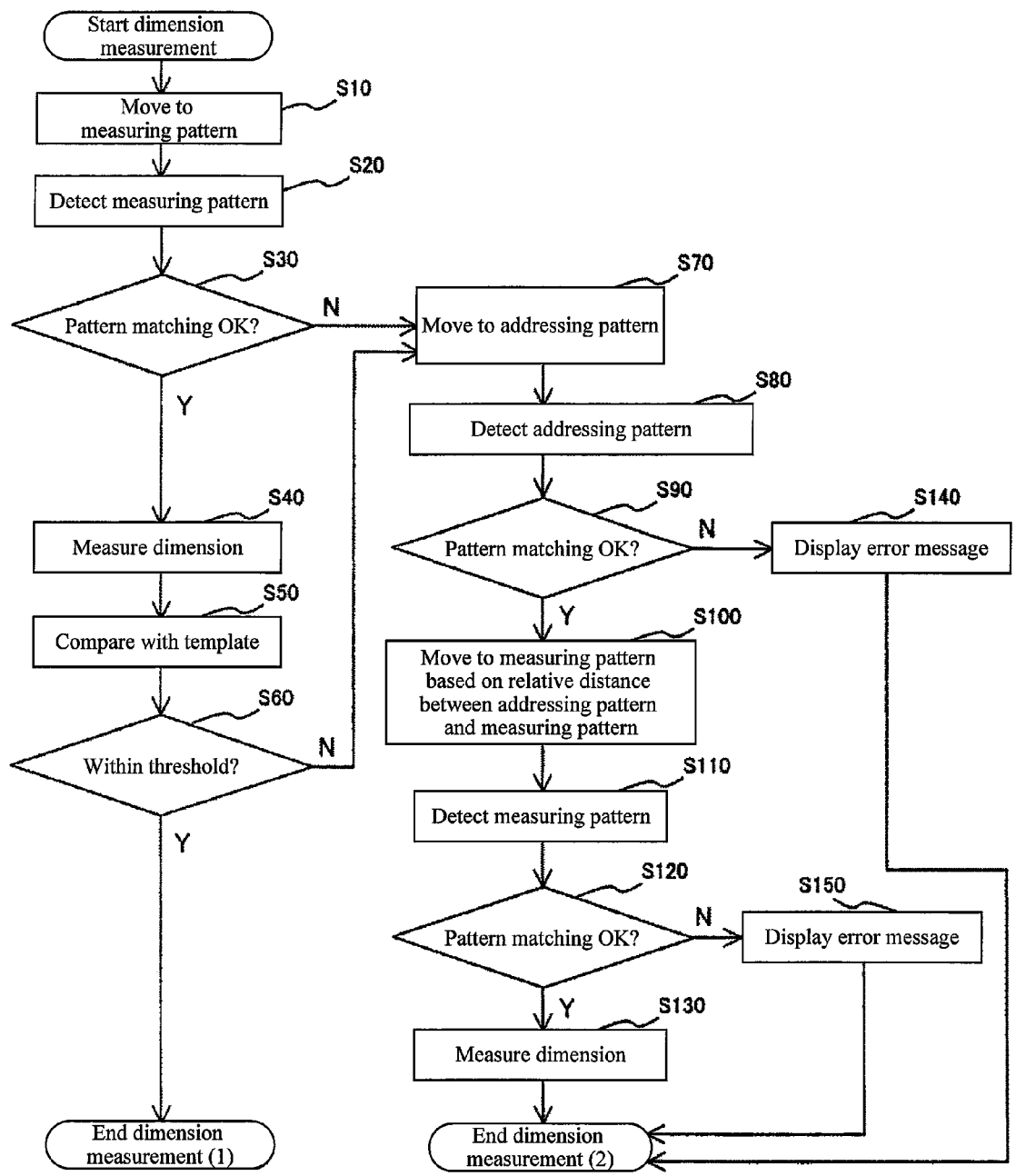
FIG. 3 is a flowchart illustrating an execution procedure of the dimension measuring method for the electron microscope apparatus according to the embodiment of the present invention.

FIG. 3 is a flowchart for illustrating a procedure of the dimension measuring method for the electron microscope apparatus according to this embodiment of the present invention.

Referring to the flowchart shown in FIG. 3, first, in step S10, the field of view is moved to the measuring pattern based on the position information about the measuring pattern previously registered. In step S20, the measuring pattern is detected. Then, in step S30, it is determined whether the detected measuring pattern matches with the previously registered measuring pattern. In this step, the magnification of the displayed image is the dimension measuring magnification. If it is determined that the two patterns match with each other (Y), the process proceeds to step S40. If it is determined that the two patterns do not match with each other (N), the process proceeds to step S70.

Now, there will be described the case (N) where it is determined that the two patterns do not match with each other in step S30. The reason why the two patterns do not match with each other can be (1) that positioning of the field of view at the measuring pattern has failed and (2) that the measuring pattern is damaged or does not exist, for example.

In any case, in this example, in step S70, the field of view is moved to the previously registered addressing pattern. In this step, the field of view can be moved either by means of the sample stage 112 or by offsetting the scanning position of the electron beam. However, from the viewpoint of the throughput of the apparatus, the latter is more preferable (the reason why the addressing pattern registered is positioned adjacent to the measuring pattern is to enable movement of the field of view by offset of the scanning position of the electron beam).

Then, in step S80, addressing pattern is detected, and in step S90, it is determined whether the detected addressing pattern matches with the previously registered addressing pattern. Since the addressing pattern is set to be larger than the measuring pattern, the magnification of the displayed image in this step is lower, and the required precision of the positioning of the field of view is less strict.

If it is determined that the two patterns do not match with each other (N), it is determined that the pattern is not appropriately formed on the wafer, the process proceeds to step S140, an error message is displayed on the image displaying CRT 111, and the dimension measurement is ended. On the other hand, if it is determined that the two patterns match with each other (Y), the process proceeds to step S100, in which the field of view is moved again to the measuring pattern based on the relative distance between the previously registered measuring pattern and the addressing pattern. In this step also, the field of view can be moved either by means of the sample stage 112 or by offsetting the scanning position of the electron beam. However, from the viewpoint of the throughput of the apparatus, the latter is more preferable.

Then, the process proceeds to step S110, in which the measuring pattern is detected, and in step S120, it is determined again whether the detected measuring pattern and the previously registered measuring pattern match with each other. The magnification of the displayed image in this step is the dimension measuring magnification. If it is determined that the two patterns do not match with each other (N), it is determined that the pattern is not appropriately formed on the wafer, the process proceeds to step S150, an error message is displayed on the image displaying CRT 111, and the dimension measurement is ended. On the other hand, if it is determined that the two patterns match with each other (Y), the process proceeds to step S130, in which the dimension measurement is carried out, and the dimension measurement is ended.

Now, there will be described the case (Y) where it is determined that the two patterns match with each other in step S30. If it is determined that the two patterns match with each other (Y), the process proceeds to step S40, in which the dimension measurement is carried out. Then, according to the present invention, the process proceeds to step S50, the measurement value is compared with the value of the template previously prepared. Then, in the comparative determination of step S60, it is determined whether the measurement value falls within a threshold. If it is determined that the measurement value falls within the threshold (Y), the dimension measurement is ended. If it is determined that the measurement value does not fall within the threshold (N), the process proceeds to step S70, and the dimension measurement is ended according to the flowchart of FIG. 3.

Figure 4:
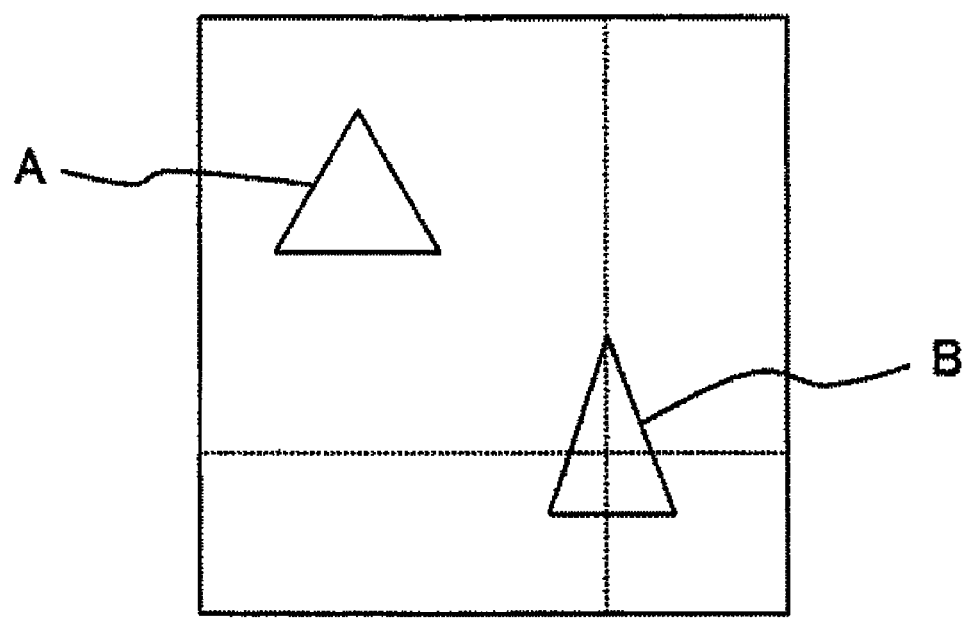
FIG. 4 is a diagram for illustrating the dimension measuring method for the electron microscope apparatus according to the embodiment of the present invention.
Figure 5:
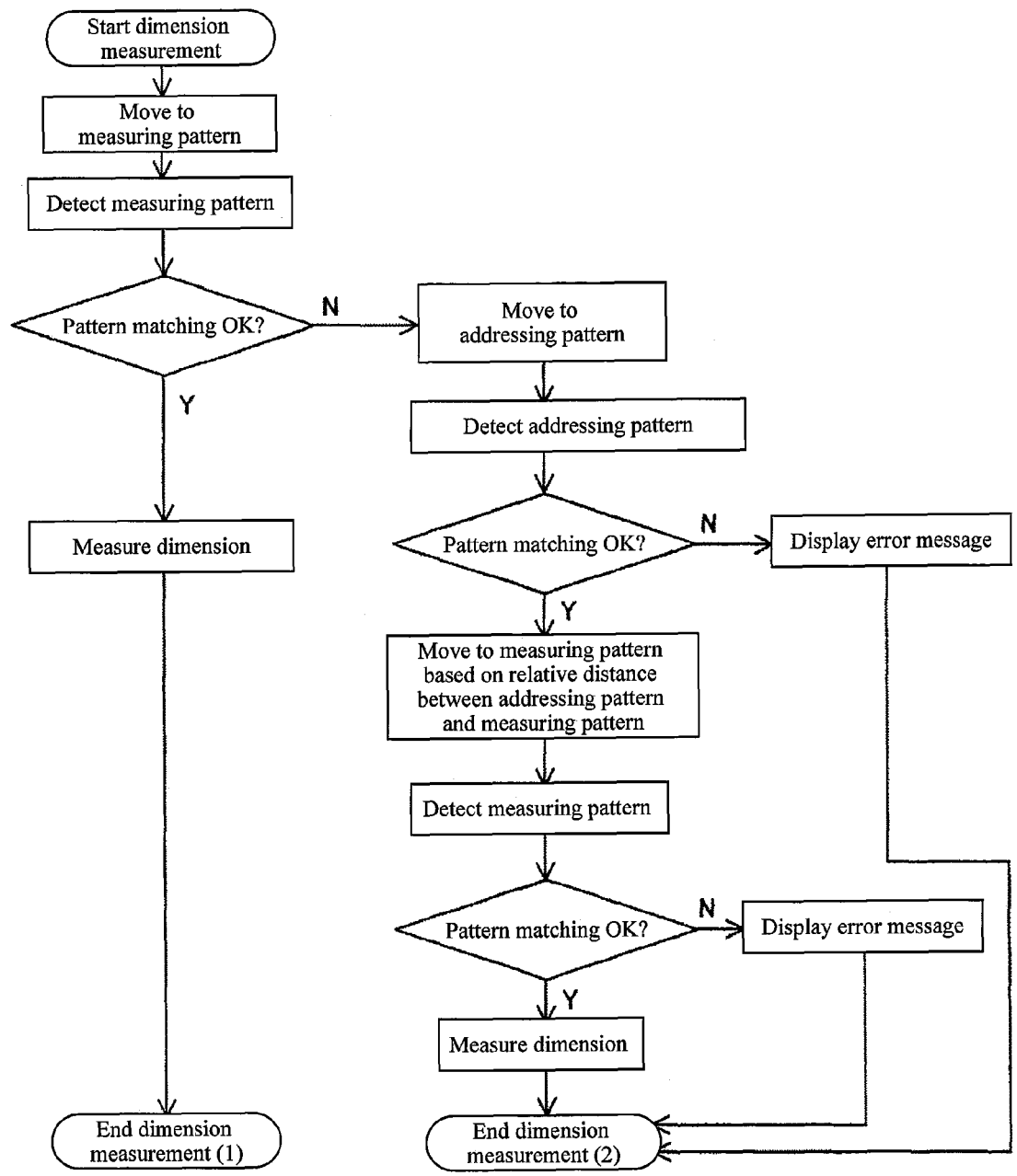
FIG. 5 is a flowchart illustrating another execution procedure of the dimension measuring method for the electron microscope apparatus according to the embodiment of the present invention.
Figure 6:
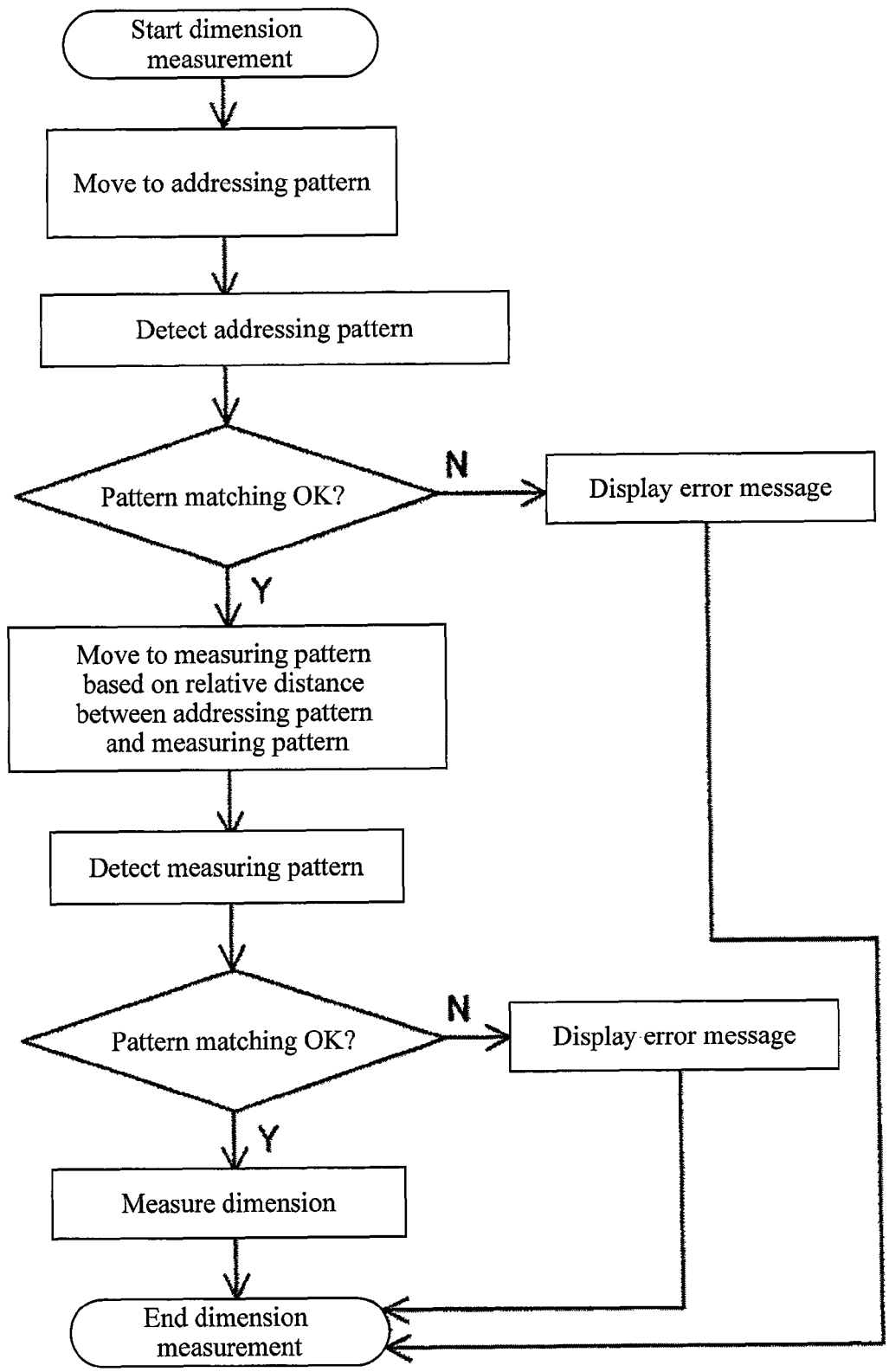
FIG. 6 is a flowchart illustrating another execution procedure of the dimension measuring method for the electron microscope apparatus according to the embodiment of the present invention.

A reason why the template is used for comparative determination of the measurement value is that there is a possibility that, if there is a different pattern B having a similar shape in the vicinity of the measuring pattern A as shown in FIG. 4, the pattern B is extracted in the matching determination of step S30 in the flowchart of FIG. 3, and the dimension thereof is measured. Another reason is that there is a possibility that, even when the movement of the field of view to the measuring pattern has failed, a similar pattern is detected, and it is determined that matching is achieved in step S30.

In this example, the comparative determination using the template can be arbitrarily omitted by the operator (for example, if there are only patterns having the same shape in the vicinity of the measuring pattern, and the dimension of any of the patterns can be measured, the comparative determination can be omitted). The flowchart in that case is shown in FIG. 5.

As described above, according to this embodiment of the present invention, in the dimension measurement, detection of the addressing pattern is necessary only when the result of the comparative determination of steps S30 and S60 in the flowchart of FIG. 3 is NO (N). Therefore, the throughput of the apparatus is improved.

Furthermore, in this embodiment of the present invention, in the case where the dimension measurement process finally ends in the dimension measurement ending step (2) in the flowchart of FIG. 3, the measuring pattern is detected twice, and the throughput of the apparatus can decrease depending on the number of times of measurement. Thus, to avoid this problem, according to the present invention, for example, in the case where a large number of measuring patterns having the same shape distributed on the same wafer are measured (or a large number of measuring patterns having the same shape on different wafers are measured), the computer 106 can monitor the time required for step S20 and the following steps and the time required for step S80 and the following steps in the flowchart of FIG. 3. And if the average required time for step S20 and the following steps is longer than the average required time for step S80 and the following steps (the first several measurement cycles, the number of which can be arbitrarily set by the operator, can be excluded), when a measuring pattern having the same shape is to be measured at a subsequent time, the dimension measurement can be carried out by automatically following the process shown in the flowchart of FIG. 6. Whether to use this feature can be arbitrarily chosen by the operator.

What is claimed is:

1. A pattern measuring method comprising:
   moving a scanning position of an electron beam to a first region based on previously registered position information about a first pattern, which is a target whose dimensions are to be measured with the electron beam;
   acquiring a first image of the first region;
   judging whether the first pattern is present in the first image;
   only when it is judged that the first pattern is not present in the first image,
   i) moving the scanning position of the electron beam to a second region that includes a previously registered second pattern, the relative distance of which from the first pattern is known;
   ii) acquiring a second image of the second region; and
   iii) moving the scanning position of said electron beam to the first region, based on information about said relative distance; and
   measuring dimensions of said target using said electron beam.

2. The pattern measuring method according to claim 1, wherein said second pattern is larger than said first pattern.

3. The pattern measuring method according to claim 1, wherein said first pattern is detected based on detection of said second pattern and said relative distance.

4. A scanning electron microscope, comprising:
   an electron gun;
   a scanning deflector for scanning a sample with an electron beam emitted from the electron gun;
   a sample stage for moving a scanning position of the electron beam to a desired region;
   a detector for detecting a pattern on the region;
   an image controlling section for judging whether a pattern is detected on the image; wherein
   the sample stage moves the scanning position of the electron beam to a first region based on previously registered position information for a first pattern, which is a target whose dimensions are to be measured with the electron beam;
   the detector detects a signal that is indicative of whether the first pattern is present in a first image of the first region;
   the image controlling section judges whether the first pattern is present in the first image;
   only in the case of a failure to detect the first pattern in the first image,
   i) the sample stage moves the scanning position to a second region which includes a previously registered second pattern, the relative distance of which from the first pattern is known;
   ii) the detector acquires a second image in the second region; and
   iii) the sample stage moves the scanning position to the first region based on information regarding said relative distance.

5. The scanning electron microscope according to claim 4, wherein the magnification of an image of said second pattern is lower than the magnification of an image of said first pattern.

6. A method for measuring dimensions of a target pattern formed on a sample, said method comprising:
   moving a scanning position of an electron beam to a first region of said sample, based on previously determined coordinate information for said target pattern;
   acquiring a first image of the first region;
   judging whether the target pattern is present in said first image;
   only when it is judged that the target pattern is not present in said first image,
   i) moving the scanning position to a second region that includes a reference pattern with a known position that has been registered previously, and whose distance from said target pattern has been determined previously;
   ii) acquiring a second image of the second region;
   iii) detecting said reference pattern in said second image;
   iv) moving the scanning position to said target pattern, based on information regarding said distance from said second pattern to said target pattern; and
   measuring dimensions of said target pattern using said electron beam.

* * * * *